United States Patent [19]

Marks

[11] Patent Number: 4,574,161
[45] Date of Patent: Mar. 4, 1986

[54] ORDERED DIPOLAR LIGHT-ELECTRIC POWER CONVERTER

[76] Inventor: Alvin M. Marks, Bigelow Rd., Athol, Mass. 01331

[21] Appl. No.: 650,708

[22] Filed: Sep. 14, 1984

Related U.S. Application Data

[63] Continuation-in-part of Ser. No. 637,405, Aug. 3, 1984, which is a continuation-in-part of Ser. No. 462,240, Mar. 2, 1983, which is a continuation-in-part of Ser. No. 330,791, Dec. 15, 1981, Pat. No. 4,445,050, and a continuation-in-part of Ser. No. 596,428, Apr. 3, 1984, which is a continuation-in-part of Ser. No. 222,377, Jan. 5, 1981, Pat. No. 4,442,019, which is a continuation of Ser. No. 909,944, May 26, 1978, abandoned.

[51] Int. Cl.$^4$ .......................................... H01L 31/04
[52] U.S. Cl. ...................................... 136/263; 357/8; 357/12
[58] Field of Search ....................... 136/263; 357/8, 12

[56] References Cited

U.S. PATENT DOCUMENTS 4,360,703  11/1982  Bolton et al. ....................... 136/263

OTHER PUBLICATIONS

Thin Solid Films, vol. 68, pp. 191–198 (1980).
Thin Solid Films, vol. 87, pp. 167–169 (1982).
Thin Solid Films, vol. 100, pp. 117–120 (1983).
C& E N, Feb. 16, 1976, pp. 32–34.

Primary Examiner—Aaron Weisstuch

[57] ABSTRACT

A bulk process is described which is capable of producing large area sheets about 8 micrometers thick having the property of light/electric power conversion at extremely high production rates (many m$^2$/s) at low cost ($1/m$^2$). The devices have an inherently high efficiency of 60–80% when laminated in an assembly to utilize both resolved light vectors. A light/electric power converter is described comprising a sheet containing oriented dipolar conducting linear structures forming an antennae array capable of absorbing light photons and producing a unidirectional electric current. These linear structures constitute submicron antennae and femto diode circuit elements. The individual antenna-circuit elements are self-ordered into the linear structure using a bulk process. The process utilizes (1) electroordering a suspension of elongated submicron metal crystals; or (2) molecules capable of absorbing a light photon and converting its energy to electric energy; or (3) visco-elastically stretch-orienting a light-electric responsive preformed heteropolymer. These submicron linear structures comprise a plurality of quantum well-steps, each with an assymetric tunnel junction at one end, in ordered three dimensional arrays. The manufacture uses a simple low cost bulk process and does not employ the submicron facility needed for the earlier planular process.

13 Claims, 10 Drawing Figures

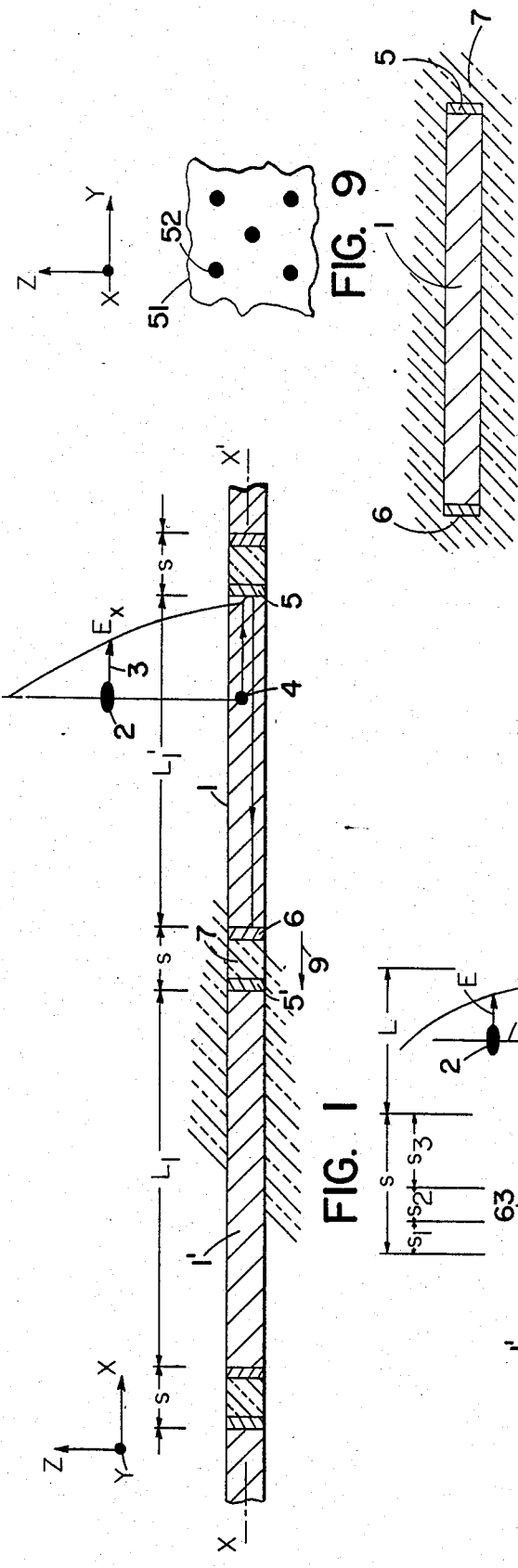
FIG. 1
FIG. 2
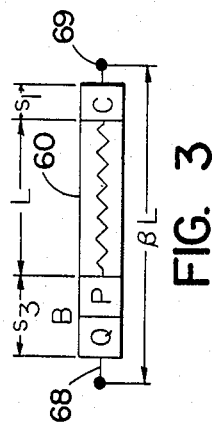
FIG. 3
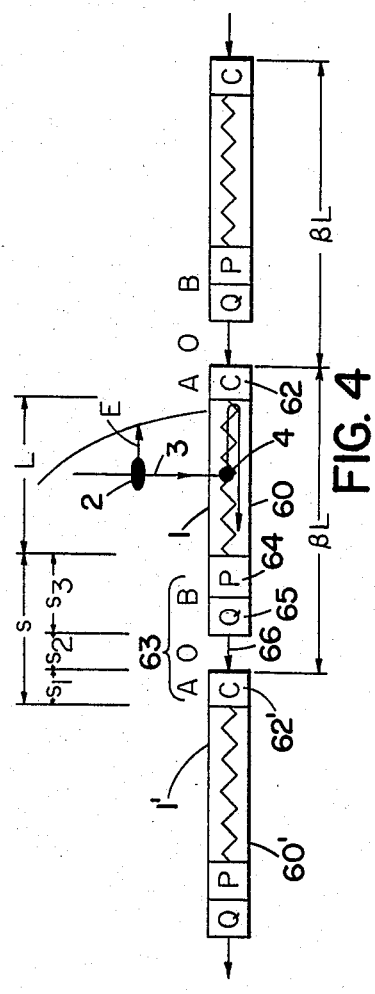
FIG. 4
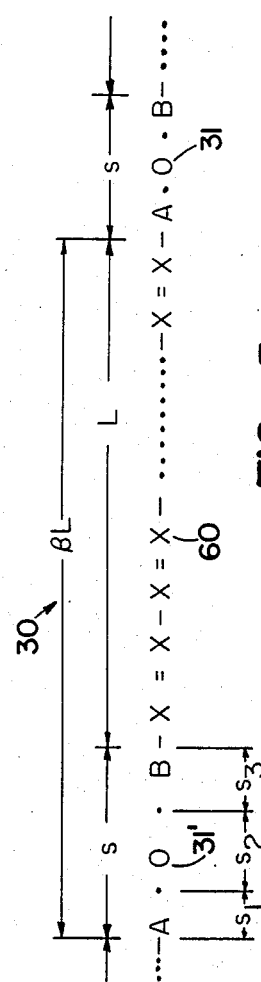
FIG. 5
FIG. 9

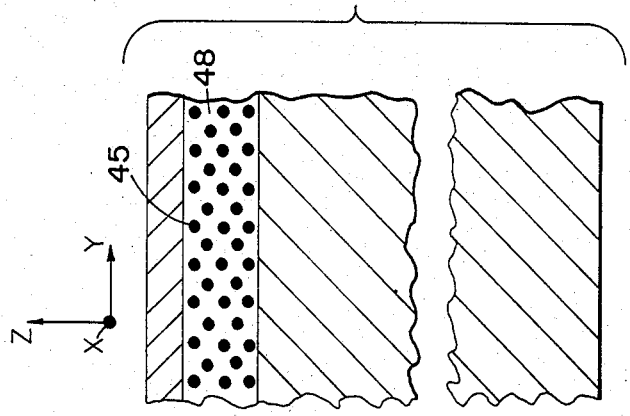
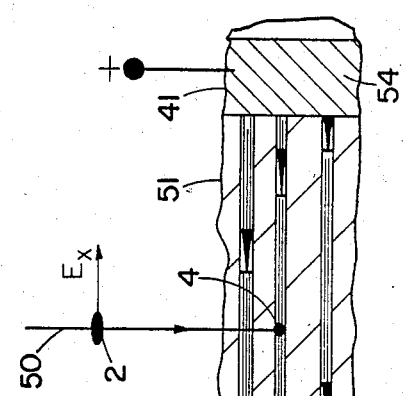
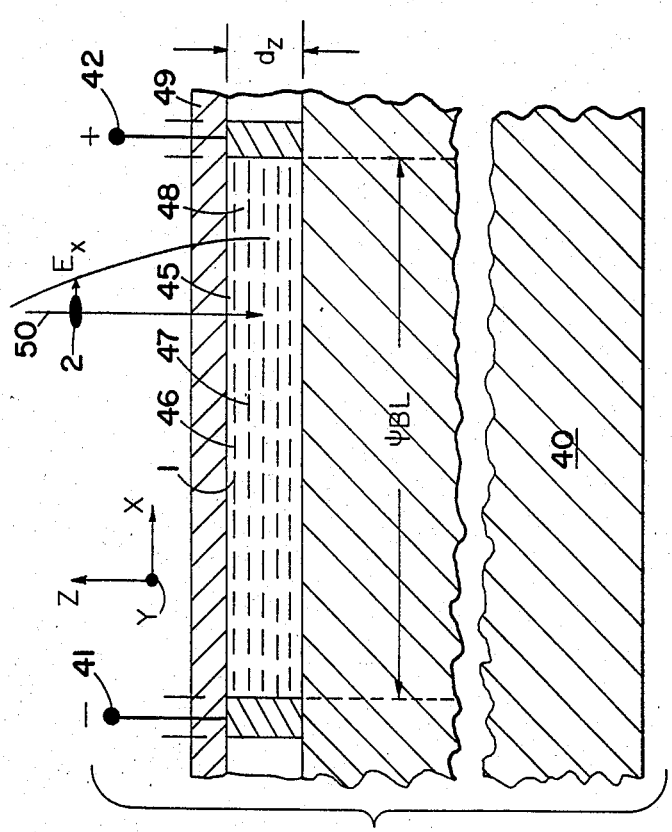
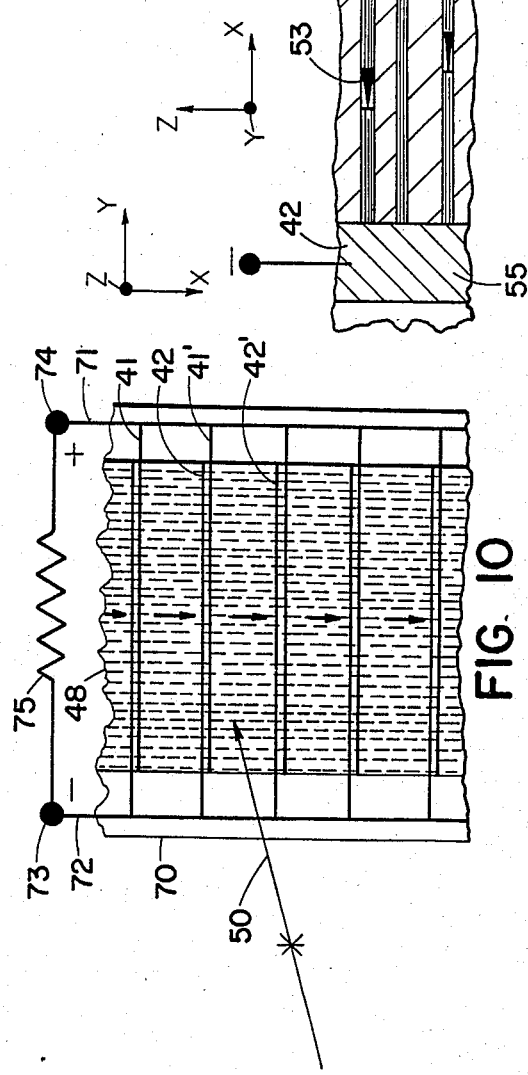
FIG. 6
FIG. 7
FIG. 8
FIG. 10

ORDERED DIPOLAR LIGHT-ELECTRIC POWER CONVERTER

CROSS-REFERENCE TO RELATED APPLICATIONS

This application is: A continuation in part of: Femto Diode and Applications, Ser. No. 637,405 filed Aug. 3, 1984, which is a continuation in part of: Improvements in Light Electric Power Conversion, Ser. No. 462,240 filed Mar. 2, 1983, which is a continuation in part of: Device for Conversion of Light Power to Electric Power Ser. No. 330,791 filed Dec. 15, 1981, now issued as U.S. Pat. No. 4,445,050 on Apr. 24, 1984; and a continuation in part of: Electro-optical Dipole Suspension with Reflective, Absorptive and Transmissive Characteristics, Ser. No. 596,428 filed Apr. 3, 1984, which is a continuation in part of: Electroordered Dipole Suspension, Ser. No. 222,377, filed Jan. 5, 1981, now U.S. Pat. No. 4,442,019 issued Apr. 10, 1984, which is a continuation of Ser. No. 909,944 filed May 26, 1978, the latter being abandoned.

All of the said patents and applications were invented by Alvin M. Marks, and are incorporated herein by reference.

FIELD OF THE INVENTION

A light/electric power converter comprising novel submicron linear dipolar structures, which constitute antennae and circuit components, and means for ordering these structures into interconnected three dimensional sheet arrays.

DEFINITIONS

Planular Process: A process which occurs on a plane surface.

Bulk Process: A process which occurs in a volume.

Heteromonomer: A monomeric unit comprising various different structures chemically bonded to each other in a particular order.

Lepcomer: A heteromonomeric molecular unit which is capable of absorbing a photon, and converting the photon energy to an increase of electrical energy by a motion of electron charge in one direction toward one end of the molecule.

Lepcopolymer: A polymer chain comprising linked lepcomer units which is capable of absorbing one or more photons, and converting the photon's energy to an increase in electrical energy by a motion of electron charges along the chain in one direction.

Lepcon ™: A trademark* referring to a light-electric power converter.

Lumeloid ™: A trademark* referring to a light-electric power converter (Lepcon ™) which comprises a lepcopolymeric sheet.

\* Owned by the Inventor, and the Marks/Aitken Children's Trust (50/50).

BACKGROUND

In U.S. Pat. No. 4,445,050 an array of submicron antennae and rectifying elements is disclosed to convert light to electric power. In the parent application Ser. No. 637,405 a submicron quantum well-step antenna and asymmetric tunnel junction configuration is disclosed which is formed as a layer on a flat (glass) surface. To manufacture this device requires a special submicron production facility using techniques previously described; the most advanced in the state of the art. The structures are precisely designed and reproduced on a submicron scale by a planular process.[1,2]

One embodiment of this invention is derived from earlier work on the manufacture of polymeric light responsive polarizing structures in which oriented conducting strings of a polyiodide I—I—I—I are held in a clathrate crystal (Herapathite), or in a stretch oriented sheet of a polyvinyl compound (polyvinyl alcohol or butyral). Other similar oriented polymeric structures are known to polarize light; for example C=C—C=C—; a polyene. Polarizing sheets are now articles commercially manufactured by a bulk process at low cost by a large scale special film casting machine, the basic cost being about $1 per m$^2$ (1984 dollars). The present invention utilizes a similar bulk process. The casting composition[3] is modified to employ the special heteropolymer of this invention made on a similar casting machine[4]. The cost should be comparable. The extra cost of electroding and laminating will add only a few dollars per m$^2$ so the total should be about $5/m$^2$ (500 w), about 50¢/sq. ft. The efficiency will remain in the 60–80% range. Thus solar energy will become available everywhere at about 1¢/watt; or, an investment cost of $10/KW.

An embodiment of this invention utilizes metal dipolar particles. The bulk manufacture of metal dipole particles has been described.[5.1] The dipolar metal particles may be oriented in a fluid medium which is solidified to fix the oriented dipoles[5.2], and electroordered into strings of conducting particles[6].

In another embodiment of this invention dipolar molecules are used instead of metal dipoles. These molecules may be similar to those naturally occuring in photosynthetic plant structures, [7.1,7.2,8.3] such as the recently reported synthetic compound,[9] which may be utilized herein. Recently, piezoelectric films have become available commercially which generate D.C. electric voltages when subjected to shear and such polymers may be modified for the purpose of this invention.[10]

BRIEF DESCRIPTION OF THE DRAWINGS

FIG. 1 diagrammatically shows a plurality of generalized structures in series, each structure comprising an antenna, and well-step asymmetric tunnel junction.

FIG. 2 diagrammatically shows an elongated metal crystal dipole with asymmetric end faces.

FIG. 3 diagrammatically shows the chemical formula of an elongated molecular dipole antenna and well-step-tunnel junction.

FIG. 4 diagrammatically shows a plurality of oriented elongated molecular dipole antenna structures.

FIG. 5 shows the chemical formula of a heteropolymer conforming to the generalized structure of FIG. 1.

FIG. 6 shows a cross-sectional view on the XZ plane of a light-electric power converter with electrodes comprising a dipolar suspension electro-ordered along the X axis.

FIG. 7 shows a cross-sectional view on the YZ plane of the device shown in FIG. 6.

FIG. 8 shows a cross-sectional view on the ZX plane of a light-electric power converter through a visoelastic-ordered (stretch oriented) lepcopolymer with electrodes.

FIG. 9 is a cross-sectional view on the ZY plane of the device of FIG. 8.

FIG. 10 shows a plan view in the XY plane of an assembled light-electric power converter with intercalated electrodes connected to a load.

DESCRIPTION

In the parent application Ser. No. 637,405 a quantum regime process is described. In this process a light photon enters a linear conductor (a metal cylinder) and produces an energetic electron which travels in a potential well-step-tunnel junction. The electron passes through the tunnel junction to a greater potential level thereby converting the light power to D.C. electric power.

The present device, which utilizes the same basic principle, is generally as shown in FIG. 1. A conductor 1 with its long axis as XX', which has a length L (1200 > L > 50Å) absorbs a photon 2, which is accompanied by its oscillating electric field vector E, 3. A free electron 4 totally absorbs the light energy quantum $\epsilon = h\nu = Ve$; where $1.8 < Ve < 3.1$ electron volts. If the electron moves toward a potential barrier 5 it is usually totally reflected back without loss of energy toward the tunnel junction interface 6; where it has a good probability (10–50%) of passing through to conductive strip 1', as shown by the arrow 9. The voltage between strips 1 and 1' is V; and the electron 4, in passing through the tunnel junction 6,7, 5' reaches the strip 1', substantially converting its kinetic energy to potential energy, and becoming a thermal electron.

The present invention differs from the invention disclosed in the parent application Ser. No. 637,405 in using a bulk process rather than a planular process, and the present submicron components are self-ordered. The self-ordering may be accomplished by an electro-ordering process in which individual dipoles are oriented while in the fluid state, and fixed by solidifying the suspending medium[5,2]; or by viscoelastic stretch of a polymeric sheet.[3,4]

In FIG. 1 the insulation material 7 between the conducting strips, 1 and 1' surrounds and suspends the strips 1 and 1'. Interface materials 6 and 5' have different work functions. The insulating medium 7 between the interface materials 6 and 5' may be an organic polymer insulator; such as a hydrocarbon, polystyrene, a modified polystyrene; or, glass. The medium 7 has a spacing S (about 20 to 40Å) between the interfaces 6 and 5'; and surrounds and suspends the strips 1 and 1'.

Referring to FIG. 2, a single dipole particle, or strip 1 is shown with end faces 5 and 6 comprising different materials; selected so that, together with the surrounding medium, the work functions are $\phi_2$ and $\phi_1$, respectively, at these interfaces.

The interface atoms or molecules B and A are chosen, so that, together with the insulating compound 7, their work functions $\phi_1$ and $\phi_2$ have these relationships:

$$\phi_1 = 0.6 \phi_2 \quad (1)$$

$$\phi_2 = V = (h/e) \quad (2)$$

These special materials 5 and 6 may be formed in situ, as follows:

The metal dipoles 1 are suspended in a medium 7 which has a low viscosity (1–100 cp) at temperature $T_1$, for example a low melting glass at 400° C. The dipoles are oriented and formed into particle strings (electro-ordered) by a process previously described.[6] An ionizable salt, for example a metal compound (NaCl, BaCO$_3$) is dissolved in the glass 7. The glass is then cooled to temperature $T_2$, for example 300° C., which increases the viscosity to about 100,000 cp and fixes the particles 1, 1' in alignment with a distance S between them. The ions of Na+ $^{orBaO+}$, and their negative partners are separated by applying a D.C. pulse. The ion velocities are large compared to the motion of the elongated strips in the D.C. field because the ionic velocity is still substantial at temperature $T_2$. A few layers of atoms of the metal ions are deposited on the face 5 if it is negative, and the negative ions travel to the face 6 which is positive. The ions are discharged; negative ions may be emitted as gases, $CO_2$ or $Cl_2$ for example. The temperature then is decreased to $T_3$ (ambient 27° C.) and residual ions are either deposited; or, none remain; or, they are immobilized in the solid medium at ambient temperature.

To form the interfaces various materials may be electrodeposited on one end of the metal dipole such as BaO or Na, previously disclosed in Ser. No. 637,405.

Many salts such as NaCl are electrolytes when melted in the absence of solvents; and some, such as silver chloride are electrolytes[7,7] even in the solid state, and can be used as a source of these ions.

BaO: the carbonate $BaCO_3$ and nitrate $Ba(NO_3)_2$ are used in glass technology as a constituent of glass; and may be used as a source of the BaO+ ion.[11]

In the parent application Ser. No. 637,405 the procedure for selecting the interface atoms or molecules is set forth and a similar approach may be employed for the selection of B and A.

In FIG. 3 there is shown a synthetic molecular structure similar to the natural chlorophyl used by plants to convert sun energy to chemical energy for metabolism. The chemical structures corresponding to B and A in FIG. 5 are indicated by Q, P, C. The heteropolymeric structure of FIG. 5 may therefore constitute repeated units of the molecule shown in FIG. 3; a lepcopolymer.

Referring to FIG. 3, the molecule comprises a porphyrin P,[8,3] a quinone Q molecule that accepts an electron from the light-excited porphyrin,[8,4] and a carotinoid C[8,5] that becomes positively charged by donating an electron to the porphyrin. The final charge separated state is C+PQ−.[9]

Such molecules may be illuminated to achieve the dipolar charge separation, while suspended in a fluid medium, and electroordered by an applied field.[6]

The charged molecules remain aligned in a string as shown in FIG. 4, where $$\frac{S+L}{L} = \beta \approx (1.03 \text{ to } 1.2) \quad (3)$$

A unidirectional current flow between molecular dipoles occurs when the electron on Q at 65 tunnels through the distances $S_2$ to discharge C+ at 62'.

The dipole elements shown in FIG. 3 are molecular dipoles 100Å > L > 40Å. The dipole elements have a length L and are spaced $L_1$ (B−β1)L apart; and the distance between the electrodes 41 and 42 is $\psi\beta L$ where $\psi$ is the number of particles in the string 46. Each particle is separated from its neighboring particle by the distance:

$$S = (\beta - 1)L \quad (4)$$

The total voltage across the terminals 41 and 42 in FIG. 6 is:

$$V_T = \psi V \text{ volts} \tag{5}$$

where $$1000 > \psi > 10 \tag{6}$$

The number of dipoles per unit area, number of particle strings per unit volume, and the concentration of dipole particles has been derived, and experimentally verified.[6] The light-electric power per unit area calculations are the same as previously given in Ser. No. 637,405.

Referring to FIG. 5, there is shown a lepcopolymer 29, comprising a linear molecular chain 60, of length L. The section 30 for example may comprise a carbon chain with conjugate bonds, or a polyiodide. The molecular diode junction is 31.

Such structures are known to be a strong absorber of light photons, when oriented by stretching; these structures are well known in commercial polarizing film. The atomic or molecular structures A O B constitute the molecular analogue of an assymetric tunnel junction, in which: $40\text{Å} > S > 5\text{Å}$. In the molecular structure O may be a nonconducting (insulating) carbon ring, such as terminates a carotenoid molecule.[7.5, 8.5]

Some inorganic polymers have a resonating structure; such as Phospho nitrile chloride [12]:

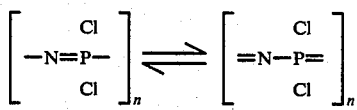

Other conducting polymers and compounds are known, and certain of these may be employed in this invention.[13]

Referring to FIG. 5, 30 is a polyene or other similar chain comprising a repeated chain of conjugated double bonds;

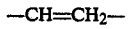

The effect of the double bonds is to decrease the energy required for the transition of electrons from a stable bonding $\pi$ orbital to an unstable $\pi^*$ antibonding orbital of greater potential energy.[8.1, 8.2]

As the number of conjugated double bonds increase the absorption moves from the ultraviolet for a $C_3$ molecule (1,3 Butadiene)($\eta=3$) to the visible for a $C_{20}$ molecule ($\beta$ carotene)($\eta=20$).

$\beta$ Carotene contains a structure of conjugated double bonds, and is a constituent of the photosynthetic chlorophyl of plants.[7.5]

When the number of pairs of $\pi$ electrons in the polyene increases, the relative symmetry alternates. The symmetry of the highest molecular orbit in the first excited state is opposite to that in the ground state.

When a photon of light energy is absorbed somewhere along the polyene a wave of electron energy moves along the chain and the terminal electron is ejected into the acceptor molecule A whereupon the $\pi^*$ (antibonding—greater energy) electron orbits in the chain recede to $\pi$ (bonding—lesser energy) electron orbits.

The lepcopolymer shown in FIG. 5 may be polymerized in situ in a head/tail orientation directly from electroordered light-induced dipolar lepcomer molecules within the casting composition. A particular direction of orientation may be chosen by illuminating the individual dipoles or lepcomer monomers and momentarily applying a strong D.C. field, for example a +voltage at $x=0$ and a −voltage at $\chi=\psi\beta L$ on the X axis. This will align the lepcomer with its +end (C+) pointing to $x=\psi\beta L$ and its negative end (PQ−) toward $x=0$. As in FIG. 8, the dipoles will all be electroordered head to tail in parallel chains, and the dipoles may be maintained in this alignment by using a square wave voltage until they are fixed in position by solidifying the suspending medium and by polymerizing the lepcomer into a lepcopolymer. The head to tail orientation of these lepcopolymer chains, after the light and electric fields are removed, will be retained because the viscosity of the casting composition increases greatly during the polymerization and the evaporation of the low-boiling solvents in the casting solution.

During the casting process, while the lepcomer is still dissolved in the fluid state and being polymerized from the lepcomer molecules, it is flowed onto the casting belt which moves with a velocity $U_1$. During this step in the process, the composition is strongly illuminated with visible light, and polymerized subjected to an intense electric field just under breakdown, to unidirectionly orient the lepcopolymer being formed.

The light causes electron charges in the lepcomer to separate. The electric field then orients the charged dipolar elongated chains head to tail, with a uniform direction of polarity. Subsequently the low boiling point solvent in the composition is evaporated but the higher boiling solvents remain temporarily to facilitate stretch orientation. The lepcopolymer sheet is then removed to a second belt at velocity $U_2$; and stretched onto the second belt as above described. Finally the sheet is passed through an oven and the higher boiling solvents are evaporated. In this finished sheet, the lepcopolymer molecular chains are oriented parallel to each other; and each have the same electric flow direction. This is diagramatically shown in FIG. 8, in which the lepcopolymer molecules 52 are shown with the same electric flow direction indicated by the arrows, 53.

The dipolar molecules shown in FIG. 4 electroordered into string as shown in FIGS. 1, 6, 8, and 9. The lepcopolymer molecules, which are viscoelastically oriented as shown in FIGS. 8 and 9, operate in the quantum regime as previously disclosed in the parent application Ser. No. 637,405. In FIG. 3 the conjugated carbon chains in the carotenoid structure constitute the well 60 in which an energetic electron 4 oscillates. The molecule 62 is at one end of the chain 60. The tunnel junction 63 (AOB) is between adjacent chains 60,60; the spacings are S and $S_2$, respectively. The energetic electron enters the porphyrin molecule P at a greater potential energy eV, and this energy is transferred at 64 to the Q molecule 65 over a distance $S_3$. The energy eV is transferred by an electron 66 to another molecule 62′ (C) by tunnelling through an insulating molecule O over a distance $S_2$. In photosynthesis this energy is used in chemical reactions.[7.1] This asymmetric molecular tunnel junction operates over distances estimated as $S_1=5\text{Å}$, $S_2=5\text{Å}$, and $S_3=15\text{Å}$. The distance S is under our control, adjustable by varying $(\beta-1)$ L; and the 3 distances may be totalled to obtain:

$$S = S_1 + S_2 + S_3; \text{ about } 10\text{-}30 \text{ Å} \tag{7}$$

In FIG. 3, the elongated molecule 60 may be terminated by nonreactive groups 68 and 69 such as $CH_2$, in which case the molecules must be held in position by solidifying the suspending medium; or, 68 and 69 may comprise reactive groups, such as —OH or —NH$_2$ which facilitate polymerization in known manner by the lepcomer 60 to form a lepcopolymer as herein described. which maintains a parallel position relative to similar molecules by stretch orientation.

Thus the molecular structure shown in FIG. 4 may be utilized in a light-electric power converting array by electroordering individual molecules in a liquid suspension and subsequently converting the liquid to a solid, for example by cooling, as previously described [5.2]; or, the molecular structure of FIG. 4 may be built into an oriented lepcopolymer of the generalized type shown in FIGS. 5 and 8 and viscoelastically oriented in a continuous sheet film or about 8 micrometers thickness utilizing for example a device similar to the film casting apparatus[4] previously described with similar casting composition[3].

Such a film, known as Lumeloid TM, may be produced in large quantities (many m$^2$/s) and at low cost ($1/m$^2$)(1984 dollars), the rate and cost being dependent on the scale of manufacture.

In FIGS. 6 and 8, light rays 50 travel along the Z axis, or at an angle thereto, are absorbed as previously described and converted to D.C. electric power.

FIG. 6 shows a cross-sectional view of a light-electric power converter on the XZ plane and FIG. 7 shows a cross-sectional view of the same device along the YZ plane. In these figures a substrate sheet 40 has a layer 48 of thickness d$_z$=10 nm in which there is suspended particle strings 46, 47 of dipole elements 45 similar to that shown in FIGS. 2 or 3 over which a protective cover plate 49 may be laminated. The dipole elements 45 shown in FIG. 2 are metal dipoles 1200Å<L<600 Å.

FIGS. 8 and 9 show cross-sections, along the ZX and ZY planes respectively, through the stretch-oriented cast film or lepcopolymer herein described. The stretch axis is the XX' axis.

In FIGS. 8 and 9 the stretch-oriented polymeric sheet 51 contains the lepcopolymer strings or chains 52 aligned along the XX' axis parallel to the stretch direction.

FIG. 10 is a plan view of a light-electric power converter in the XY plane showing an intercalated electrode structure on the sheet 48. The sheet 48 may be laminated to a supporting sheet 70. Light ray 50 along the Z axis or at an angle thereto impinges on the sheet 48, the XY plane containing the light-electric power converting material between the conductors 41, 42; 41', 42'.

The conductors 41, 42; 41', 42'; are connected as shown to the bus bars 71, 72; the busbars are connected to the terminals 73,74; and the load 75 is connected between the terminals. The conductors 41,42 are directly in contact within the medium with the oriented dipole strings as shown in FIG. 8.

In the polymeric sheet converter shown in FIG. 8, the regions 54 and 55 which constitute the conductors 41 and 42 in FIG. 10, are made conductive. They may be permeated in a conductive pattern by lithographic means; for example by a salt which may be reduced to a metal to form the conductive regions 54 and 55; or conductive metal atoms may be introduced from an ion gun; these practices being well known in the art.

Two sheet light-electric power converters shown in FIG. 10 may be placed orthogonally one over the other (as in FIG. 3 of U.S. Pat. No. 4,445,050); optionally, they may be laminated together to form a unitary composite sheet, adapted to convert all incident random or ordinary light power directly to electric power, with an efficiency of 60–80%. The terminal electrodes on these sheets may be connected in parallel or in series. In both cases the output electric power is the same.

REFERENCES

1. Microfabrication as a Scientific Tool. R. E. Howard, P. F. Liao, W. J. Scocpol. L. D. Jackel, H. G. Craighead of Bell Telephone Labs, Holmdel, N.J. Science—July 8, 1983 Vol 221 4606, pp. 117–121.
2. National Research & Resource Facility for Submicron Structures. NRRFSS at Cornell University. Engineering Quarterly Cornell Vol 18, No. 3, Winter 1983–1984 and Autumn 1983 issue. Discovery in the Submicron Domain. Campus Road, Ithaca, NY 14853.
3. Casting Composition for Light Polarizing Film. U.S. Pat. No. 3,300,426 issued Jan. 24, 1967. Alvin M. Marks.
4. Film Casting Apparatus. U.S. Pat. No. 3,263,272 issued Aug. 2, 1966. Alvin M. Marks.
5. Electro-optical Dipolar Material. U.S. Pat. No. 3,813,265 issued May 28, 1974. Alvin M. Marks.
   5.1: Cols 11–13 incl
   5.2: Cols 19–20
6. Electro-ordered Dipole Suspension. U.S. Pat. No. 4,442,019 issued Apr. 10, 1984. Alvin M. Marks.
7. ncyclopedia Britannica 1968 Edition.
   7.1 Photosynthesis 17-1002c (17-1005c,17-1212b Carotene)
   7.2 Chlorophyl 6-95b-6-94d
   7.3 Photochemistry 17-922b
   7.4 Quinones 18-969b
   7.5 Carotenoids long chain compounds containing conjugate double bond polyenes 13-503c
   7.6 23–64a conjugate bonds have a high probability of absorbing visible radiation (transform)
   7.7 8-228c silver chloride—ion source
8. Organic Chemistry 4th Edition 1983. Morrison and Boyd; Allyn and Bacon, Boston. Double Bonds, Orbitals.
   8.1 Chapter 7 pp 267–269 incl
   8.2 Chapter 33 pp 1196–1197, 1208–1209
   8.3 Porphyrin
      p1272 pyrole ring
      p1269 chlorophyl
   8.4 Quinone (pBenzoquinone) p 1184
   8.5 Carotene pp 689, 1153
9. A Step Toward Synthesizing Photosynthesis. S. Weisburd. Science News Vol 125, Mar. 3, 1984, p. 132.
10. Piezoelectric Films
11. Glass J. Home Dickenson, Chemical Publishing Co. 1951. p. 98. 212 Fifth Ave. N.Y., N.Y.
12. Chemistry Of High Polymers, Maurice L. Higgens p. 124 John Wh 1 & Sons Inc. 1958.
13. Number of Organic Superconductors Grows (also organic conductors at ambient temperature). Thomas E. Maugh II. Science Nov. 1983 Vol 222 No. 4624 p. 607–607.

The disclosures herein shall not be limited by the theoretical presentation; and various modifications may be made without departing from the scope of this invention.

What I wish to claim is:

1. A light/electric power converter comprising a sheet-like volume, a plurality of elongated light-absorbing electrically-conducting particles in said sheet, said elongated particles being linearly arranged along an axis in strings; said light energy being converted to energetic electrons in said strings, asymmetric junctions interspersed and connected to said particles
   in said strings, said asymmetric junctions passing said electrons in only one direction along said conducting strings; said strings being substantially parallel, a first electrode and a second electrode connected to a first terminal and a second terminal respectively; said particle strings being normal to and between said first and second electrodes, a load, said load being connected between said first and second terminals, whereby light power is converted in said sheet to electric power and delivered to said load.

2. A light-electric power converter according to claim 1 in which the elongated particles are metal and the asymmetric junctions comprise different materials on the ends of said particles which have different work functions, said particles being arranged in parallel strings suspended in an insulating medium.

3. A light-electric power converter according to claim 2 in which the elongated particles are metal and of length $L \approx 1000$ Å and the asymmetric junctions comprise materials having work functions $\phi_2$ and $\phi_1$ respectively, at the facing surfaces of said particles in which $V=(e/h)\gamma=\phi_2$ and $\phi_1=0.6\ \phi_2$, and in which the distance between particles $S \approx 30$ Å.

4. A light-electric power converter according to claim 1 in which the elongated conductive particles are conductive molecules, and the said asymmetric junctions are molecular and chemically bonded to said conductive molecules.

5. A light-electric power converter according to claim 4 in which the said conductive molecule is a conjugate carbon chain, a terminal molecule attached to said chain, and the asymmetric junction chemically bonded thereto comprises a porphyrin and a quinone.

6. A light-electric power converter according to claim 5 in which said conjugate carbon chain and terminal group is a carotenoid.

7. A light-electric power converter according to claim 1 in which said particle strings are a lepcopolymer.

8. A light-electric power converter according to claim 7 and in which said asymmetric junction is a molecular structure located along and bonded to said lepcopolymer.

9. A light-electric power converter according to claim 8 in which said asymmetric junction comprises an electron-acceptor molecule molecularly linked to an electron-donor molecule.

10. A sheet electric power converter according to claim 1, in which said electrodes are formed in situ within said sheet in a predetermined pattern.

11. A sheet electric power converter according to claim 10 in which said electrodes are formed in situ within said sheet, said electrodes comprising a salt reduced to a metal within said sheet in a predetermined pattern.

12. A sheet electric power converter according to claim 1 in which said electrodes are formed in situ within said sheet, said electrodes being deposited by an ion beam which penetrates said sheet in a predetermined pattern.

13. A sheet electric power converter according to claim 1, in which said first and second electrodes are formed in situ within said sheet, said deposition taking place continuously in the production of said sheet.

* * * * *